United States Patent [19]

Umeki et al.

[11] Patent Number: 5,776,639
[45] Date of Patent: Jul. 7, 1998

[54] EXPOSURE MASK, METHOD OF PRODUCING THE SAME, EXPOSURE MASK PRODUCING APPARATUS, AND METHOD OF FORMING SURFACE PROFILE ON MATERIAL USING EXPOSURE MASK

[75] Inventors: Kazuhiro Umeki; Shosen Sato, both of Hanamaki, Japan

[73] Assignee: Ricoh Optical Industries, Co., Ltd., Hanamaki, Japan

[21] Appl. No.: 629,224

[22] Filed: Apr. 8, 1996

[51] Int. Cl.$^6$ ............................................. G03F 9/00
[52] U.S. Cl. ................................................ 430/5; 430/22
[58] Field of Search ........................ 430/5, 22; 358/448

[56] References Cited

U.S. PATENT DOCUMENTS 5,369,282  11/1994  Arai et al. ........................ 250/492.22

*Primary Examiner*—S. Rosasco
*Attorney, Agent, or Firm*—Oblon, Spivak, McClelland, Maier & Neustadt, P.C.

[57] ABSTRACT

A two-dimensional shape of a dotted pattern and optical densities of dots or sizes of dots having the same optical density are calculated as write data on the basis of a target distribution of transmittance. The dotted pattern is optically written on a photosensitive medium in accordance with the calculated write data, using a beam from a light source whose output is stepwise or sequentially variable. A latent dotted pattern on the photosensitive medium is developed, thereby obtaining an exposure mask having a desired two-dimensional distribution of transmittance expressed by the dotted pattern and the optical densities of dots or the sizes of dots having the same optical density.

6 Claims, 4 Drawing Sheets

FIG. 1(a)
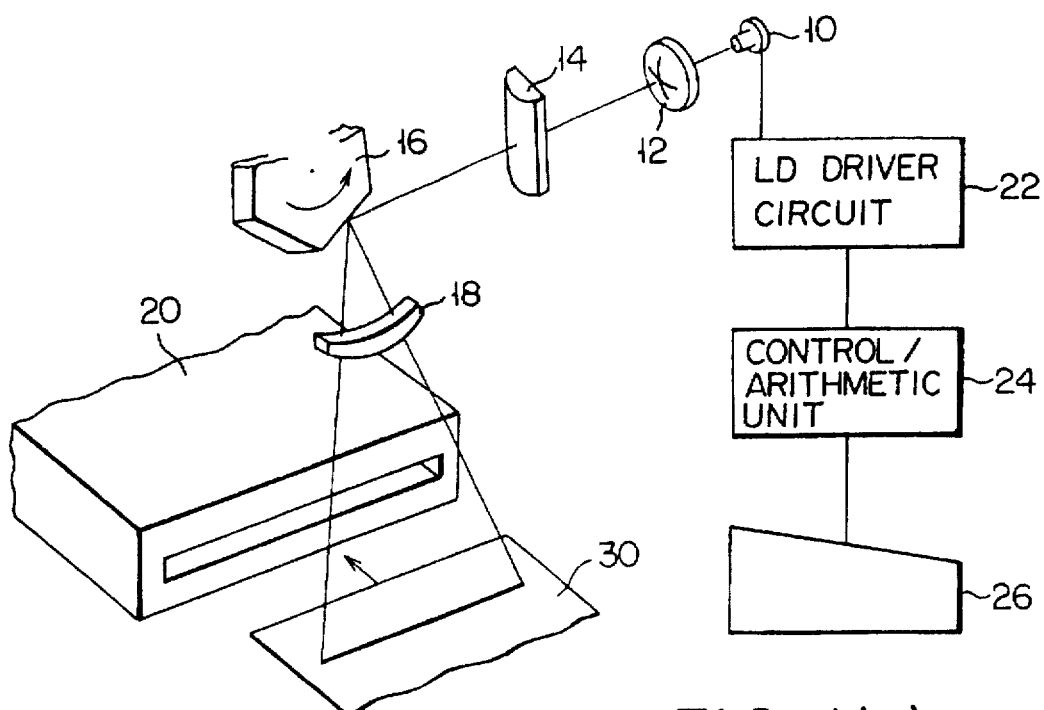
FIG. 1(c)
FIG. 1(b)
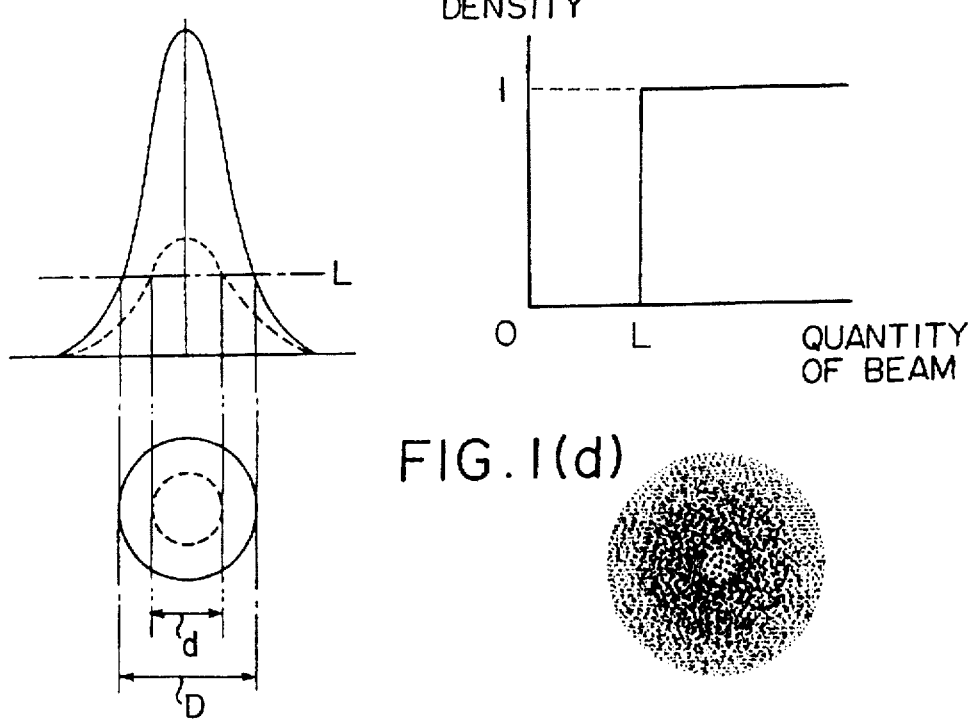
FIG. 1(d)
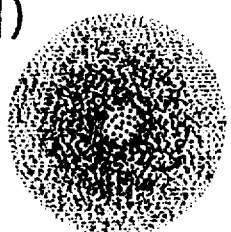
FIG. 1(e)

EXPOSURE MASK, METHOD OF PRODUCING THE SAME, EXPOSURE MASK PRODUCING APPARATUS, AND METHOD OF FORMING SURFACE PROFILE ON MATERIAL USING EXPOSURE MASK

FIELD OF THE INVENTION

The present invention relates to an exposure mask, a method of producing the exposure mask, an exposure mask producing apparatus, and a method of forming a surface profile on a material using the exposure mask.

BACKGROUND OF THE INVENTION

A novel method of producing an optical device has been proposed in Japanese Patent Laid-Open Publication No. Hei 5-173,003. Specifically, a photoresist film deposited on an optical material is exposed by a photolithograpic technique in which the intensity of exposing light varies radially from the center of a circle or oval. The photoresist film has its surface transformed to a convex bump by a development process. Then, the convex photoresist film and the optical material are etched, thereby copying the convex bump onto the optical material.

The foregoing publication also discloses a method of forming a concave shape on the optical material. In this method, a concave shape is formed on a surface of a photoresist film by the photolithographic technique, and is transferred onto a optical material by the etching process.

Various techniques have been proposed in the publication for performing the foregoing exposure method. For example, an image having a uniform optical density and a circular or oval pattern on a photomask is transferred onto a photoresist film using a lens having a low resolution. Further, a circular black spot is photographed in an out-of-focus state, thereby obtaining a negative film having a vague circular pattern whose photographic density radially increases from the center thereof. The negative film is closely contacted with a photoresist film, which is then exposed via the negative film.

In the foregoing methods, since the distribution of exposure intensities is precisely determined, for example, by the foregoing out-of-focus state and the circular spot, it is rather difficult to design the distribution of exposure intensities as desired.

It is desirable that the distribution of exposure intensity can be freely designed so as to form bumps having a convex, concave or aspherical profile on an optical device material.

SUMMARY OF THE INVENTION

It is an object of the present invention to provide an exposure mask having a desired two-dimensional distribution of transmittance.

Another object of the invention is to provide a method for producing the foregoing exposure mask.

A further object of the invention is to provide a method of forming a desired surface profile on a photoresist film using the foregoing exposure mask.

A still further object of the invention is to provide an apparatus for producing the foregoing exposure mask.

According to a first aspect of the invention, there is provided a method of producing an exposure mask having a target two-dimensional distribution of transmittance. The method comprises the steps of: calculating, as write data, a two-dimensional shape of a dotted pattern and "optical densities of dots" or "sizes of dot having the same optical density" in accordance with the target distribution of transmittance; optically writing the calculated write data onto a photosensitive medium by varying an amount of beam from a light source in a stepwise or sequential manner; and developing a latent dotted pattern written on the photosensitive medium so as to obtain an exposure mask having the target two-dimensional distribution of transmittance expressed by the two-dimensional shape of the dotted pattern and the optical densities of dots or the sizes of dots having the same optical density. The target two-dimensional distribution of transmittance is determined beforehand as a design criteria of the exposure mask.

The two-dimensional shape of the dotted pattern corresponds to a single two-dimensional distribution of transmittance. The dotted pattern may be circular, oval or rectangular. The exposure mask may have one or more dotted patterns with the two-dimensional distribution of transmittance of the same or similar type. For example, the exposure mask may have one or more rows of the dotted patterns which have the same or similar type of distribution of transmittance and are arranged two-dimensionally.

In the dotted pattern, the distribution of transmittance may be expressed as an absolute density or area density. The absolute density denotes that dots on the exposure mask have the same size but have different optical densities in accordance with their positions in the distribution of transmittance. The area density denotes that the dots have the same optical density but have different sizes in accordance with their positions in the distribution of transmittance. The lower the optical densities, the smaller the dots.

The invention is intended to provide an exposure mask produced by the foregoing method.

In a second aspect of the invention, there is provided a method of forming a surface shape on a photoresist film using an exposure mask and a photolithographic technique. The method comprises the steps of: closely contacting the exposure mask defined in claim 3 with a photoresist film having a given thickness and laid on a support; and exposing the photoresist film via the exposure mask so as to form the surface profile on the photoresist film in accordance with two-dimensional distribution of transmittance of the exposure mask.

According to a third aspect of the invention, there is provided a method of obtaining a surface profile using an exposure mask and the photolithographic technique. The method comprises the steps of forming, with a desired magnification, an image of the exposure mask defined in claim 3 on a photoresist film having a given thickness and laid on a support, and exposing the photoresist film via the exposure mask so as to obtain a surface profile on the photoresist film in accordance with two-dimensional distribution of transmittance of the exposure mask.

When the dotted pattern is circular, oval or rectangular, circular, oval or rectangular bumps or recesses may be formed on the photoresist film. The photoresist film with the foregoing bumps or recesses and the support are subject to anisotropic etching, thereby forming bumps or recesses on the support. The circular or oval bumps or recesses can be used to form microlenses, microlens arrays, micro concave mirrors, micro convex mirrors, or micro concave or convex mirror arrays.

Further, the rectangular bumps can be used to form a cylindrical surface on the support. Such a cylindrical optical device is effective as a micro cylindrical lens or a micro cylindrical lens array. A Fresnel lens or a unidirectional diffraction grating may be also formed when an appropriate dotted pattern is used.

In accordance with a fourth aspect of the invention, there is provided an apparatus for producing an exposure mask. The apparatus comprises: a variable output write unit for optically writing a dotted pattern on a photosensitive medium using a beam from a light source whose output is variable stepwise or sequentially; a dotted pattern generating unit for calculating a profile of a dotted pattern and optical densities of dots or sizes of dots having the same optical density as write data in accordance with a target distribution of transmittance; an output varying unit for varying an output of the light source in accordance with the write data; and a developing unit for developing a latent dotted pattern written on the photosensitive medium. The output varying unit may be a conventional optical write unit which can vary an output of the power source sequentially or in a stepwise manner.

The dotted pattern generating unit may be a computer having a program for calculating the shape of the dotted pattern and the optical densities of dots or the sizes of dots having the same optical density, or a dedicated central processing unit CPU. The developing unit may be integral with or separate from a part of the exposure mask producing apparatus.

These and other objects, features and benefits of the invention will be better understood from consideration of the following detailed description taken into conjunction with the accompanying drawings.

BRIEF DESCRIPTION OF THE DRAWINGS

FIG. 1(a) is a perspective view of a main part of an exposure mask producing apparatus according to an embodiment of the invention;

FIG. 1(b) shows a relationship between the distribution of an amount of beam on optical spots collected on a photosensitive medium and blackened regions on the photosensitive medium;

FIG. 1(c) is a graph showing photosensitive characteristics of the photosensitive medium;

FIG. 1(d) shows a dotted pattern obtained by developing a latent dotted pattern written on the photosensitive medium;

DESCRIPTION OF THE PREFERRED EMBODIMENT

Figure 2:
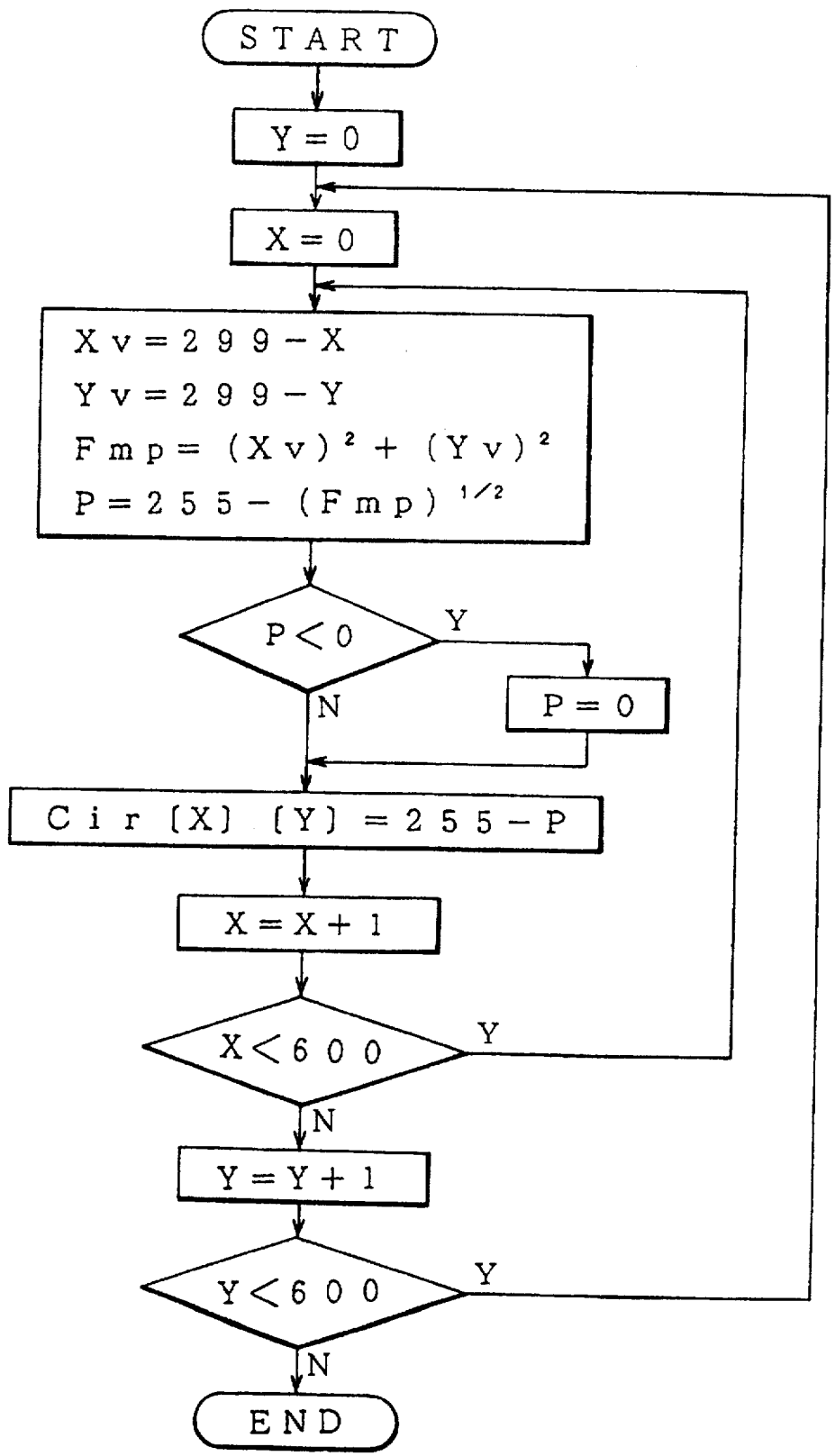
FIG. 2 is a flowchart showing a sequence for creating data to write the dotted pattern shown in FIGS. 1(a) to 1(d)

An exposure mask of the invention has a two-dimensional distribution of transmittance which corresponds to a shape of a dotted pattern and optical densities of dots or sizes of dots having the same optical density. The shape of the dotted pattern and optical densities of dots or sizes of dots having the same optical density are calculated as write data so as to accomplish a target distribution of transmittance. The write data are used to vary an output of a variable output write unit.

A photosensitive medium with a latent dotted pattern written by the variable output write unit is developed so as to obtain an exposure mask having the target two-dimensional distribution of transmittance in accordance with the shape of the dotted pattern and the optical densities of dots or the sizes of dots having the same optical density.

The exposure mask is used to expose a photoresist film which is laid on a support of an optical device material and has a given thickness. Specifically, the exposure mask is closely contacted with the photoresist film, and is exposed together, or the pattern of the exposure mask is copied on the photoresist film with a desired magnification.

The invention will be described with reference to an embodiment shown in the accompanying drawings. In this embodiment, the transmittance is expressed by the area density, i.e. the dots have the same optical intensity and have different sizes depending upon their position in the distribution of transmittance.

FIG. 1(a) shows the configuration of the main part of an exposure mask producing apparatus. In the apparatus, a light source unit comprises a light source 10 and a collimator lens 12. The light source 10 is a semi-conductor laser. When actuated by an LD driver circuit 22, the light source 10 emits a divergent laser beam, which is converted into a substantially parallel beam by the collimator lens 12. The substantially parallel beam is incident into a cylindrical lens 14.

The cylindrical lens 14 unidirectionally converges the incident parallel beam so as to form a line image. A polygon mirror 16 has its deflection-reflection surface near the line image, and rotates so as to deflect a reflected beam. Here, a surface which the deflected and reflected beam sweeps is called the "deflecting surface". The line image is parallel to the deflecting surface.

The deflected beam is incident into an fθ lens 18, which collects the beam as an optical spot on a surface to be scanned. A photosensitive medium 30 is moved in synchronization with the scanned surface, by a moving member (e.g. a conveyor belt, not shown) at an equal speed in a direction shown by an arrow in FIG. 1(a). Thus, the photosensitive medium 30 is two-dimensionally scanned by the optical spot. When an output of the light source 10 is modulated in this state, modulated output data will be written on the photosensitive medium 30.

The light source unit (i.e. semiconductor laser 10 and collimator lens 12), the cylindrical lens 14, the polygon mirror 16, fθ lens 18, the LD driver circuit 22 and the moving member constitute the variable output write unit.

A control/arithmetic unit 24 controls the LD driver circuit 22, which then controls an amount of beam to be emitted by the light source 10 (semiconductor laser). In other words, the output of the light source 10 is varied stepwise or sequentially. Therefore, both the LD driver circuit 22 and the control/arithmetic unit 24 constitute the output varying unit.

The optically written photosensitive medium 30 is conveyed to a developing unit 20, where the latent pattern on the photosensitive medium 30 is developed into a visible pattern.

The following assumptions are made here so as to enhance a clear understanding of the invention. The output of the light source 10 is variable stepwise (e.g. in N steps). The photosensitive medium 30 is a negative for printing, which has excellent hard γ characteristics (i.e. the characteristics are shown in an idealized state in FIG. 1c). Such a negative becomes completely black (i.e. photographic density: 1) when it is exposed by a beam having a quantity more than L while it is not blackened (i.e. photographic density: 0) when it is exposed by a beam having a quantity less than L.

The quantity of beam (a product of luminous intensity and time required to expose one circular dot ) of the optical spot collected on the photosensitive medium 30 is expressed by a Gaussian-like shape with respect to a space (abscissa), as shown in FIG. 1(b). The photosensitive medium 30 is completely blackened at an area where it is exposed by a beam having a quantity of more than L.

For instance, it is assumed that the light source 10 emits a maximum amount of beam as shown by a solid line in FIG. 1(b). In this case, the photosensitive medium 30 is completely blackened within a circular area having a diameter D. On the other hand, the photosensitive medium 30 is completely blackened within a circular area having a diameter d when it is exposed by the beam (shown by a dashed line) which is less than the maximum output.

When a dot exposed by the maximum output is assumed to have a size "1", a dot exposed by light less than the maximum output has a size "$(d/D)^2$". Transmittance at a pixel including the dot exposed by the beam having the distribution of beam quantity denoted by the dashed line of FIG. 1(b) is expressed by "$1-(d/D)^2$".

Further, assume that transmittance is distributed in a circular shape, and linearly gradually increases from the center toward the periphery. Such distribution of transmittance is called "distribution F". Further, the distribution F is set as a function F(x, y) using the center of rectangular coordinates x and y as the origin.

The function F (x, y) is entered using an input unit 26 such as a keyboard. The control/arithmetic unit 24 calculates data of a dotted pattern whose profile and dot sizes are expressed by the function F(x, y), and controls the LD driver circuit 22 using this dotted pattern data as write data. The LD driver circuit 22 controls the semiconductor laser 10 such that it emits beams in N steps. The input unit 26 and the control/arithmetic unit 24 constitute the dotted pattern generating unit.

The quantity of beam emitted by the semiconductor laser 10 is increased so that dots corresponding to small values of the function F (x, y) become large. On the contrary, the quantity of light emission is reduced so that dots corresponding to large values of the function F (x, y) become smaller.

A latent image of the dotted pattern is written on the photosensitive medium 30 as described above, and is developed by the developing unit 20, thereby producing a dotted pattern as shown in FIG. 1(d). The developed dotted pattern has an optical density which is high at the center and is gradually reduced toward the periphery. A uniform beam which is irradiated onto the exposure mask carrying such a dotted pattern has an intensity proportional to the function F (x, y).

When the parallel beam is orthogonally irradiated onto the surface of photoresist film, its intensity at a depth H from the surface of photoresist film, is generally expressed by formula (1).

$$A \cdot \exp(-kH) \tag{1}$$

where A denotes intensity of the parallel beams, and k is a constant.

An amount of beams for sensitizing the photoresist film at the depth H is expressed by:

$$A \cdot \exp(-kH) \cdot T \tag{2}$$

where T denotes the length of time for exposing the photoresist film.

A depth Ho of the exposed portion of the photoresist film is derived as a solution of equation (3):

$$A \cdot \exp(-kH_O) \cdot T = \delta \tag{3}$$

where δ denotes a threshold of the amount of beam for sensitizing the photoresist film. Assuming that "$kH_O$" is minute, the equation (3) can be modified to equation (4) by expanding the left side of (3).

$$A \cdot T \cdot (1-kH_O) = \delta \tag{4}$$

Equation (4) can be modified into formula (5).

$$A = \delta / \{T \cdot (1-kH_O)\} \tag{5}$$

The right side of equation (5) is expanded with respect to "$kH_O$", and a primary term is calculated by neglecting the second and succeeding higher order terms, thereby deriving formula (6).

$$A = (\delta/T) \cdot (1+kH_O) \tag{6}$$

In a domain where approximation of formula (6) is valid, the depth $H_O$ of the exposed area of the photoresist film is in the proportional relationship with the intensity A of exposing beam. Therefore, when the exposure mask has two-dimensional distribution of transmittance "tr(X, Y)", the photoresist film is exposed via the exposure mask to a depth of "α·tr(X, Y)", where α is a constant. Thus, a surface profile α·tr(X, Y) can be formed on the photoresist.

The exposure mask carrying the dotted pattern (shown in FIG. 1(d)) is closely contacted with the photoresist film, is exposed together with the photoresist film, and then developed. Thus, the photoresist film has a convex surface profile in accordance with the distribution of transmittance of the exposure mask.

The foregoing approximation is not valid when the photoresist film is so thick that it needs a long exposure time. In such a case, the surface profile formed on the photoresist film can, however, be exactly determined in accordance with the intensity distribution of the exposing beam and the exposure time. Therefore, the transmittance distribution of the exposure mask, which is utilized for producing a desired surface profile under particular exposure conditions, can be determined by performing an inverse arithmetic operation. In this case, both the shape of the dotted pattern and the optical densities of dots can be calculated, so an exposure mask having desired transmittance distribution can be produced.

The distribution of transmittance has been described in terms of the area density in this embodiment. However, when it is expressed by the absolute density, a dotted pattern on an exposure mask may be written on a photosensitive material with the γ characteristics, in which the photographic density varies substantially linearly with an amount of the exposure beam. In such an exposure mask, the optical densities vary from dot to dot with a variation of luminous intensity of the optical spot. In this case, a dotted pattern similar to that shown in FIG. 1(d) has optical densities which vary somewhat smoothly. In this case, data for writing the dotted pattern is calculated using a formula in which the γ characteristics are taken into consideration.

The exposure mask having the desired transmittance distribution can be produced reliably and easily.

One example of a procedure for calculating the dotted pattern writing data will be described with reference to the flowchart in FIG. 2. In the example, the dotted pattern is assumed to be written in a two-dimensional domain comprising 600×600 pixels, on a one-pixel-one-dot basis. The origin of the orthogonal coordinates X and Y is present in one corner of the two-dimensional domain, and the central coordinates of the dotted pattern are X=Y=299.

A dotted pattern to be obtained is in the shape of a circle whose radius corresponds to 255 pixels. Referring to FIG. 2, "Xv, Yv" denote "X and Y" components which are the coordinates X, Y and the center of the dotted pattern. "Fmp" denotes the square of the distance between the coordinates X, Y and the center of the dotted pattern.

The dotted pattern has 256 optical densities ranging between 0 (transmittance 100%) and 255 (transmittance 0%). The square root of Fmp denotes a distance between a pixel at the coordinates X, Y and the center of the dotted pattern. Further, P is derived by subtracting the square of Fmp from 255.

The dot to be written into the pixel at the coordinates X, Y has an optical density 255-P, which is expressed as "Cir|X| |Y|". In this dotted pattern, the optical density is 255 at the center (X=Y=299) thereof, linearly reduces in accordance with a distance from the center, and is 0 at the 255th pixel from the center. The optical density is 0 outside the dotted pattern (i.e. outside the 255th pixel).

When the distribution of transmittance is expressed in terms of the area density, the dotted pattern is as shown in FIG. 1(d), for example.

"Mini copy film HR3 (trade name) manufactured by Fuji Film Co., Ltd." was used as the photographic negative having excellent hard γ characteristics. The foregoing dotted pattern was written onto the Mini copy film HR3, and was developed for three minutes at 25° C. using a developer "COPINAL" (trade name). An exposure mask having the dotted pattern as shown in FIG. 1(d) was obtained.

Figure 3:
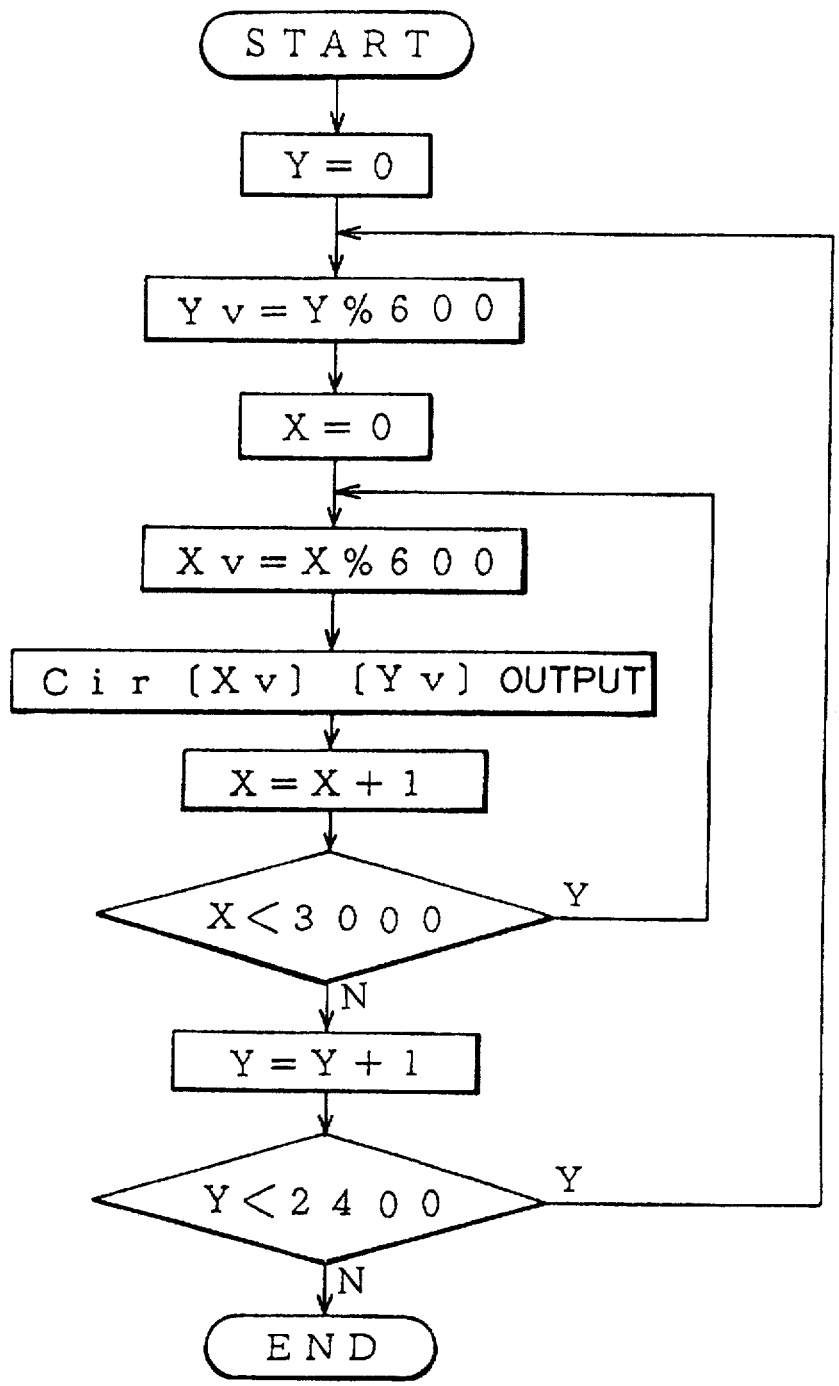
FIG. 3 is a flowchart showing a sequence for outputting the dotted pattern data created in the process shown in FIG. 2.

The dotted pattern data as the write data was repeatedly outputted at a pitch of 600 pixels in the X and Y directions so as to optically form five dotted patterns and four dotted patterns in the X and Y directions, respectively, in accordance with the sequence shown in the flowchart of FIG. 3.

In FIG. 3, "X%600" and "Y%600" denote remainders which are derived by dividing X and Y by 600, respectively, and correspond to "Xv" and "Yv" in FIG. 2.

When the dotted pattern is written in accordance with the sequence shown in FIG. 3, an exposure mask has a series of dotted patterns (shown in FIG. 1(d) copied in five columns and four rows.

A size of the dotted pattern, which is formed on the photosensitive medium, depends upon the size of a two-dimensional domain where the dotted pattern is copied (i.e. 600×600 pixels, in this example), and a size of each dot (i.e. a diameter of the optical spot). Gradation of the optical densities (i.e. sizes of the dots) depends upon the number of steps (i.e. 255 in this example) in which the output of the semiconductor laser 10 is variable.

The exposure mask is closely contacted with the photoresist film, which is exposed by beams applied via the exposure mask. Alternatively, the pattern on the exposure mask may be projected onto the photoresist film with a desired magnification.

Figure 4:
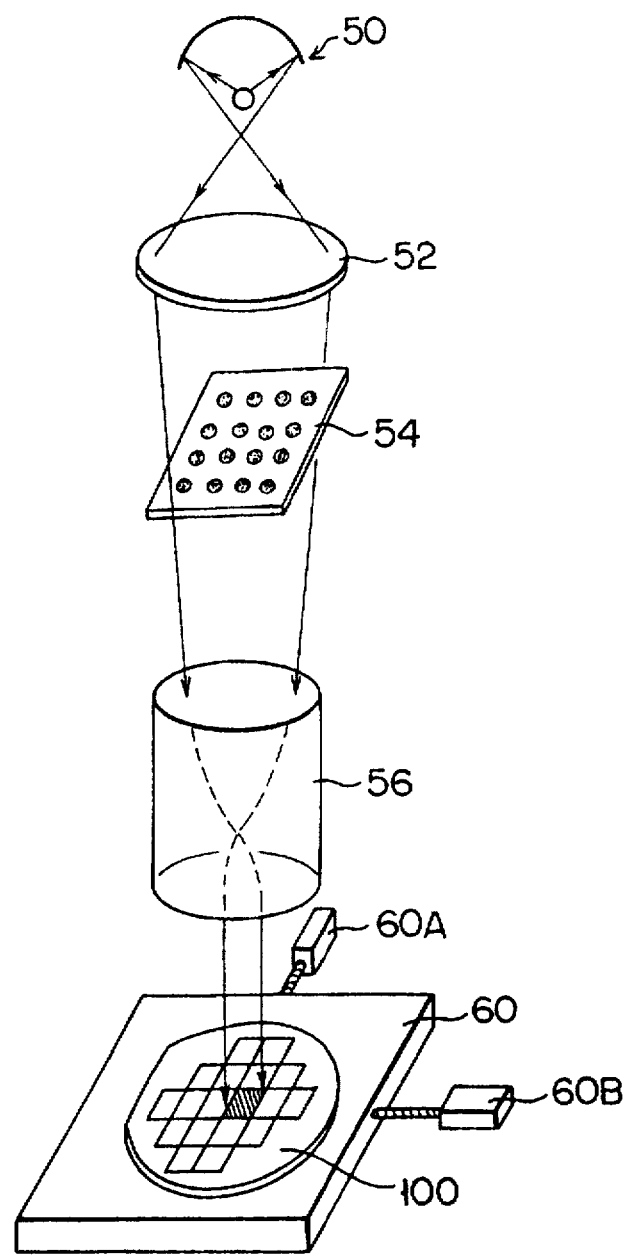
FIG. 4 shows one example of an exposure method using the exposure mask pattern.

The foregoing process will be described with reference to an example shown in FIG. 4.

A beam from a light source 50 is collected by a collective lens 52, and irradiates an exposure mask 54. The beam passing through the exposure mask 54 is incident into an image forming lens 56 for a reduction. A reduced image of the dotted pattern on the exposure mask is copied on a surface of an optical device material 100. In other words, the copied pattern has a reduced scale.

The optical device material 100 is made of a 6-μm thick photoresist film and a support. The photoresist film is obtained by spin-coating a positive OFR 800 (trade name of Tokyo Ohka Co., Ltd.) on a surface of a quartz substrate as the support, and prebaking it.

A stage 60 holds the optical device material 100 thereon, and is displaceable, by step motors 60A and 60B, in two directions which are orthogonal to each other and orthogonal to an optical axis of the image forming lens 56. The optical device material 100 is aligned with the optical axis of the image forming lens 56.

The exposure mask 54 is made of a silver salt photographic negative with a size of 20 mm×20 mm. This negative is a T-MAX400 professional film/5053 manufactured by Kodak Co., Ltd. When this negative is developed for 9 to 11 minutes at 24° C. using a "KODAK-MAX" developer (trade name), this negative has the γ characteristics in which the photographic density is substantially linearly proportional to an amount of exposure beam. Sixty-four (8×8) latent circular dotted patterns having the absolute density are written on the photographic negative at a 2.5 mm pitch, and are developed as described above. The transmittance is 0% at the center of each dotted pattern, and gradually increases in proportion to the square of distance from the center.

A reduction ratio of the image forming lens 56 is set to 1/10. Thus, the pattern on the exposure mask 54 is copied, at the reduced scale, on a 2 mm×2 mm area of the photoresist film (of the optical device material 100). In this case, a plurality of the copied patterns are spaced with a 0.25 mm pitch therebetween. The optical device material 100 is subject to the foregoing exposure process over its entire surface in each 2 mm×2 mm area in turn.

The photoresist film is then developed, so sixty-four spherical bumps are formed on each of the exposed portions.

Thereafter, the photoresist film and quartz substrate are dry-etched so as to transfer the spherical bumps onto the quartz substrate. The quartz substrate is then separated for each exposed region, so a micro lens array having 8×8 micro lenses is obtained.

When a negative photoresist film is used in place of the positive photosensitive film in the foregoing embodiment, it is possible to obtain the photoresist film having spherical recesses.

The exposure mask having the dotted pattern in which the distribution of transmittance is expressed by the absolute density is effective in exposing the exposure pattern which is in close contact with the photoresist film, or in exposing the exposure pattern by forming a reduced pattern on the photoresist film. Further, when the exposure pattern has a dotted pattern in which the distribution of transmittance is expressed by the area density, it is particularly effective in forming a reduced image on the photoresist film.

What is claimed is:

1. A method of producing an exposure mask having a target two-dimensional distribution of transmittance, the method comprising the steps of:

(a) calculating, as write data, a two-dimensional shape of a dotted pattern and optical densities of dots or sizes of dots having the same optical density in accordance with the target distribution of transmittance which varies with position in the dotted pattern;

(b) optically writing the calculated write data on a photosensitive medium by varying an amount of beam from a light source in a stepwise or continuous manner; and (c) developing a latent dotted pattern written on the photosensitive medium so as to obtain an exposure mask having the target two-dimensional distribution of transmittance expressed by the two-dimensional shape of the dotted pattern and the optical densities of dots or the sizes of dots having the same optical density.

2. The method as in claim 1, wherein the dotted pattern is circular, oval or rectangular.

3. An exposure mask produced by the method defined in claim 1 or 2.

4. A method of forming a surface profile on a material, made of a support and a photoresist film laid on the support and having a predetermined thickness, using an exposure mask and a photolithographic technique, the method comprising the steps of:

(a) closely contacting the exposure mask defined in claim 3 with the photoresist film on the support; and (b) exposing the photoresist film via the exposure mask so as to form the surface profile on the photoresist film in accordance with two-dimensional distribution of transmittance of the exposure mask.

5. A method of forming a surface profile on a material, made of a support and a photoresist film laid on the support and having a predetermined thickness, using an exposure mask and a photolithographic technique, the method comprising the step of forming, with a desired scale change, an image of the exposure mask defined in claim 3 on a photoresist film having a given thickness and laid on a support of an optical device material to expose the exposure mask and photoresist film, thereby forming a surface profile on the photoresist film in accordance with two-dimensional distribution of transmittance of the exposure mask.

6. An apparatus for executing the method of producing an exposure mask defined in claim 1 or 2, the apparatus comprising:

(a) a variable output write unit for optically writing a dotted pattern on a photosensitive medium using a beam from a light source whose output is variable stepwise or continuously;

(b) dotted pattern generating means for calculating a two-dimensional shape of the dotted pattern and optical densities of dots or sizes of dots having the same optical density as write data in accordance with a target distribution of transmittance;

(c) output varying means for varying the output of the light source in accordance with the write data; and (d) a developing unit for developing a latent dotted pattern written on the photosensitive medium.

* * * * *